(12) United States Patent
Budniak et al.

(10) Patent No.: US 6,844,712 B2
(45) Date of Patent: Jan. 18, 2005

(54) MULTI-TEST CIRCUIT BREAKER LOCATOR HAVING A TRANSMITTER AND A RECEIVER

(75) Inventors: Mitchell Budniak, Highland Park, IL (US); Joachim Wottrich, Oak Park, IL (US); Ronald A. Coia, North Riverside, IL (US)

(73) Assignee: Unique Technologies, LLC, LaGrange Park, IL (US)

( * ) Notice: Subject to any disclaimer, the term of this patent is extended or adjusted under 35 U.S.C. 154(b) by 43 days.

(21) Appl. No.: 09/748,068

(22) Filed: Dec. 22, 2000

(65) Prior Publication Data

US 2002/0030476 A1 Mar. 14, 2002

(Under 37 CFR 1.47)

Related U.S. Application Data

(63) Continuation-in-part of application No. 09/061,434, filed on Apr. 17, 1998, now Pat. No. 6,166,532.

(51) Int. Cl.$^7$ .......................... G01R 19/00; G01R 31/00
(52) U.S. Cl. .......................... 324/67; 324/133; 324/508; 324/542

(58) Field of Search .................. 324/508, 527–530, 324/66, 67, 133, 506, 509, 538, 539, 541, 542

(56) References Cited

U.S. PATENT DOCUMENTS 4,121,152 A * 10/1978 Hale et al. .................. 324/66
4,906,938 A * 3/1990 Konopka .................. 324/66

* cited by examiner

*Primary Examiner*—Jay Patidar
(74) *Attorney, Agent, or Firm*—Sonnenschein, Nath & Rosenthal

(57) ABSTRACT

A system for locating a circuit interrupter associated with a selected branch circuit. The system includes a passive transmitter that creates a current spike at a predetermined frequency and a receiver broadly tuned about that predetermined frequency. The current spike signal has a sufficiently short spike duration and a sufficient amplitude so as to substantially minimize development of a sympathetic signal on other branch circuits adjacent to the selected branch circuit. The passive transmitter includes a voltage controlled switch in series with a charge storage device. The receiver drives a user-perceivable signaling device upon sensing the current spike. Related subsystems and methods are also disclosed.

57 Claims, 8 Drawing Sheets

US 6,844,712 B2

MULTI-TEST CIRCUIT BREAKER LOCATOR HAVING A TRANSMITTER AND A RECEIVER

STATEMENT OF RELATED APPLICATIONS

This application is a continuation in part of application Ser. No. 09/061,434 filed Apr. 17, 1998 now U.S. Pat. No. 6,166,532.

FIELD OF THE INVENTION

The present invention relates in general to electrical power line test equipment devices and, in particular, to a system for distinguishing the circuit-interrupting device (circuit breaker or fuse) associated with a particular electrical line from a plurality of circuit interrupting devices.

BACKGROUND ART

When electrical work needs to be performed on an electrical system in a building or facility, it is usually necessary to trace and identify which circuit interrupter device (i.e., circuit breaker or fuse) is supplying power to a specific AC power branch circuit.

Manual identification of the fuse or circuit breaker can be accomplished by removing each fuse or opening each circuit breaker, thereby disrupting the power flow through the circuit. Each test point must subsequently be examined to determine whether the power to the test point has been disconnected. This method is not only time consuming, but also may not be feasible in situations where it would be hazardous to interrupt the power flow to certain branch circuit outlets, i.e., in a hospital or in environments where there are computers in use without backup power.

Accordingly, there is a need to provide a circuit tester that provides an identification signal that is easily detectable by an adequately sensitive receiver, and is simple to implement and inexpensive to produce.

Accordingly, there is also a need for a circuit tester that provides more reliable identification of a selected circuit branch while making it easier and less time consuming for the user to operate by eliminating the need for manual calibration and the associated potential for user error.

These and other useful aspects of the invention will be apparent to those of ordinary skill in the art having the present drawings, specification and claims before them.

SUMMARY OF THE INVENTION

Some of the foregoing needs are met and problems solved by a system for locating a circuit interrupter associated with a selected branch circuit. The system includes a passive transmitter that creates a current spike at a predetermined frequency and a receiver broadly tuned about that predetermined frequency. The current spike signal has a sufficiently short spike duration and a sufficient amplitude so as to substantially minimize development of a sympathetic signal on other branch circuits adjacent to the selected branch circuit. The passive transmitter includes a voltage controlled switch in series with a charge storage device. The receiver drives a user-perceivable signaling device upon sensing the current spike.

The invention further results in a method for locating a circuit interrupter associated with a selected branch circuit from amongst a plurality of circuit interrupting devices. The method comprises: (a) operably connecting a passive transmitter to a selected branch circuit, said passive transmitter having a voltage controlled switch in series with a charge storage device; (b) creating a current spike on the selected branch circuit at a predetermined frequency; (c) inducing only a substantially weak electromagnetic field about the selected branch circuit by limiting the current spike signal to a sufficiently short duration; (d) placing a receiver broadly tuned about the predetermined frequency of the current spike signal in physical proximity to each of the plurality of circuit interrupting devices individually; and (e) driving a user-perceivable signaling device when the receiver is coupled to the weak electromagnetic field generated at the predetermined frequency of the current spike signal.

BEST MODE OF CARRYING OUT THE PRESENT INVENTION

Figure 1:
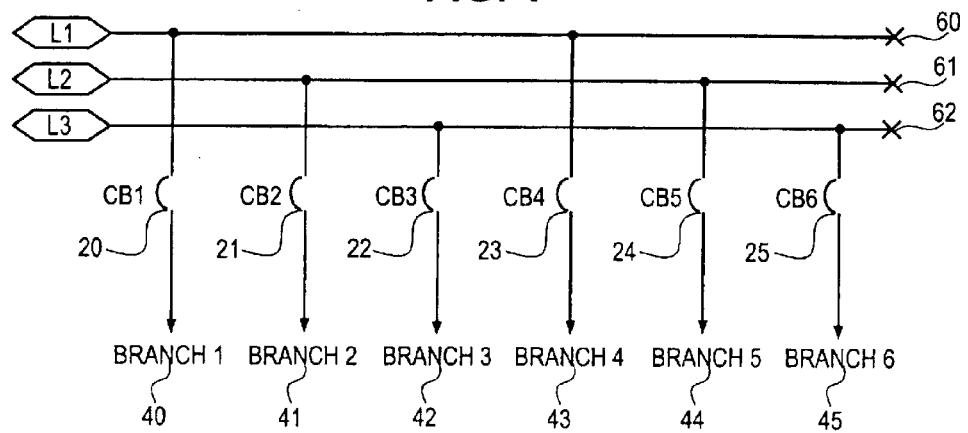
FIG. 1 is a wiring diagram illustrating a potential AC power distribution panel providing power to a plurality of branch circuits through their respective circuit interrupting devices.

While the present invention may be embodied in many different forms, there are shown in the drawings and discussed herein several potential embodiments with the understanding that the present disclosure is to be considered only as an exemplification of the principles of the invention and is not intended to limit the invention to the embodiments illustrated.

The present system as disclosed herein locates the circuit interrupter associated with a particular branch circuit from amongst a plurality of circuit interrupting devices. FIG. 1 schematically depicts a potential AC power distribution panel 10 having three power line bus bars 60, 61 and 62 and a plurality of circuit interrupting devices (CB1, CB2, CB3, CB4, CB5 and CB6) each connected in series between a respective bus bar and a respective branch circuit (40, 41, 42, 43, 44, and 45, respectively). Although AC power distribution panel 10 is depicted as using circuit breakers, it would be understood by one of ordinary skill in the art that the present system would operate in the manner disclosed herein to locate any type of circuit interrupter device including, but not limited to circuit breakers and fuses. As is known in the art, each circuit interrupter device provides overload protection to its associated branch circuit. While AC power distribution panel 10 reflects a balancing of power distribution loads (i.e. each power line bus bar distributes power to an equal number of branch circuits), it should be understood that power does not have to be evenly distributed for the present system to operate in the manner disclosed herein.

Branch circuits 40, 41, 42, 43, 44, and 45 as shown in AC power distribution panel 10 are hot leads. Each branch circuit also includes a neutral lead (not shown in FIG. 1) that together with the branch circuit's hot lead supplies AC power to loads operably connected to the respective branch circuit. The branch circuit may also include a ground lead in order to provide ground fault protection.

The present system for locating a circuit interrupter associated with a particular branch circuit is comprised of two separate devices, a receiver and a passive transmitter. The transmitter generates an identification signal that is coupled to the power line, and may additionally have the functionality of a receptacle analyzer and an optional GFCI (ground fault circuit interrupter) tester. The receiver detects the identification signal generated by the transmitter in order to identify a particular branch circuit. The receiver may also have the additional functionality of sensing live AC wiring.

The passive transmitter described herein will operate in multiple wiring situations, so long as the hot conductor is available on one of the branch circuit terminals, and either neutral or ground is connected to one of the remaining terminals.

Figure 2:
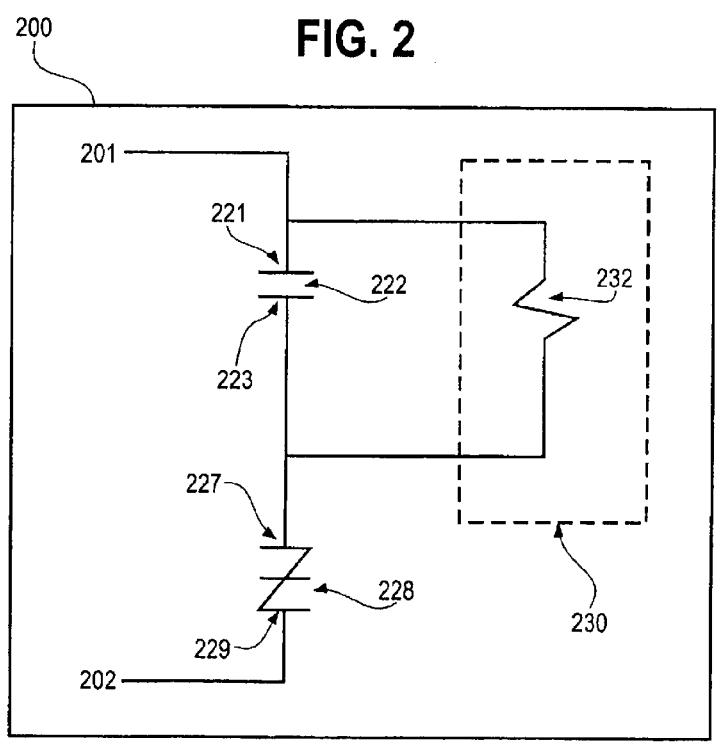
FIG. 2 is a schematic diagram illustrating the various components in one potential embodiment of the passive transmitter of the present invention.

FIG. 2 of the drawings depicts a potential embodiment of the passive transmitter that can be used within the present system. Passive transmitter 200 has a first lead 201 and a second lead 202 for operably connecting to a particular branch circuit. This connection may be accomplished by mating the passive transmitter to a selected branch circuit via a standard power outlet (not shown) or by other standard means such as probes, alligator clips, and other elements well known in the art. To illustrate operation of the present system, it is assumed that user has already connected passive transmitter 200 to branch circuit 40 in order to locate the circuit interrupter associated with that selected branch circuit. The passive transmitter will function as described below as long as power (from hot lead in branch circuit) is supplied to either first lead 201 or second lead 202 and either neutral or ground is connected to the other lead.

Passive transmitter 200 further includes a charge storage device 222 and a voltage controlled switch 228 connected in series. In the preferred embodiment of the invention, a first terminal 221 of charge storage device 222 is operably connected to first lead 201, and a second terminal 223 of charge storage device 222 is operably connected in series with a first terminal 227 of voltage controlled switch 228. A second terminal 229 of voltage controlled switch 228 is then operably connected to second lead 202. However, the order of charge storage device 222 and voltage controlled switch 228 may be changed without altering the functionality of the firing circuit.

As long as power is supplied to either first lead 201 or second lead 202, passive transmitter 200 will create a current spike when connected to the branch circuit. On the positive half cycle of the AC wave, current through the circuit is initially blocked by the voltage controlled switch 228. Once the voltage across voltage controlled switch 228 reaches the breakover voltage of voltage controlled switch 228, the voltage controlled switch conducts current, thus allowing charge storage device 222 to charge. The voltage across charge storage device 222 quickly rises to the instantaneous level of the power line voltage imposed between leads 201 and 202, which has just reached the breakover voltage. The voltage quickly rises because the AC power line and voltage controlled switch 228 (in its "on" state) have a very low combined impedance. During the charging of the charge storage device 222, the current through charge storage device 222 is initially high. As the charge storage device charges, the current through voltage controlled switch 228 decreases. Once the current through voltage controlled switch 228 falls below a minimum holding current, voltage controlled switch 228 reverts to a blocking stage and the current stops being conducted. As a result, a current spike of very short duration is drawn through passive transmitter 200 and, thus through the particular branch circuit to which the passive transmitter is connected.

In one preferred embodiment of the invention, voltage controlled switch 228 is a SIDAC, having a breakover voltage, Vz, of 90V. It is contemplated that a SIDAC with a different breakover voltage may be used so long as Vz is no greater than the expected line voltage. Furthermore, the charge storage device is preferably a capacitor.

Discharge circuit 230 is connected in parallel with charge storage device 222. Once current is no longer being conducted through voltage controlled switch, the energy stored by charge storage device 222 is discharged through the discharge circuit 230. Because the leakage resistance of most devices that may be used as the charge storage device is too high to permit the charge storage device to discharge rapidly enough to generate a sufficient quantity of current spikes, discharge circuit 230 is utilized to remove the charge across charge storage device 222 so that subsequent current spikes may be generated.

In one preferred embodiment, the discharge circuit is comprised of a resistor 232. The resistor in parallel with the charge storage device forms an RC circuit. It is contemplated that resistor 232 is chosen such that the time constant for the RC circuit is about 10–12 ms. As a result, a single current spike is created during each single half cycle of a standard 60 Hz AC waveform. However, it is contemplated that resistor 232 may be chosen to create a different time constant in order to change the duration of time it takes charge storage device 222 to discharge. With a shorter time constant, the voltage drop across voltage controlled switch 228 may once again reach the breakover current during the same positive half cycle of a standard 60 Hz AC waveform. As a result, the voltage controlled switch 228 may once again begin to conduct current and a second current spike will be created during the same half cycle of the AC waveform. Thus, multiple current spikes may be generated during one half cycle of the AC waveform. By selecting values for the components, the above process repeats during the negative half of the AC wave. Thus, passive transmitter 200 may generate a current spike during each half cycle of the AC wave. Of course, with other waveforms (e.g. 50 Hz AC) similar results can be achieved by selecting the nominal values of the components appropriately.

The current spike signal in selected branch circuit 40 creates an electromagnetic field about branch circuit 40. Unavoidably, the electromagnetic field will generate a current spike on any branch circuits adjacent (i.e. within the created electromagnetic field) to the particularly selected branch circuit (i.e., branch circuit 40). However, the current spike signal produced by passive transmitter 200 is of significantly short duration that there is insufficient time for a full strength sympathetic signal to develop in the other, unselected but adjacent branch circuits. Consequently, the difference in signal strength between the current spike signal produced by passive transmitter 200 on the particularly selected branch circuit and any sympathetic signals developed on any adjacent branch circuits is of such magnitude that they can be distinguished from one another.

Figure 3:
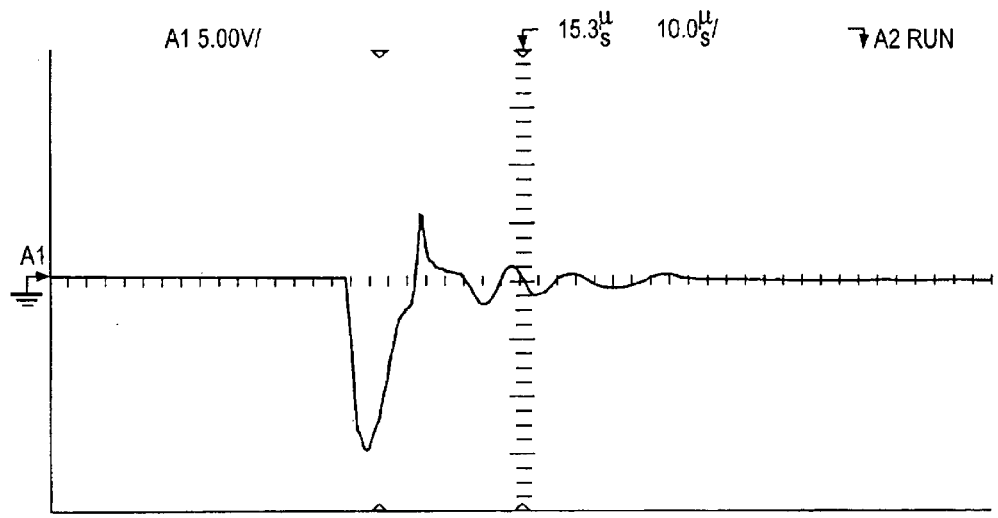
FIG. 3 is an illustrative plot of a current spike signal produced by the passive transmitter of FIG. 2 across a 1 ohm non-inductive resistor in an earth ground circuit.

FIG. 3 of the drawings illustrates a negative-going current spike generated by the negative-going phase of the AC waveform. In this example, the current spike is generated by a passive transmitter 200 with resistor 232 having a value of 12 kilo-ohms and charge storage device 222 being a capacitor having a value of 0.47 microfarads. As shown, the resulting current spike signal has a magnitude on the order of 15 amps and a pulse width duration on the order of 10 microseconds. As would be known to one of ordinary skill in the art, additional loads and associated impedances on a particular branch circuit will likely change the resulting amplitude and duration of the current spike signal.

Figure 4:
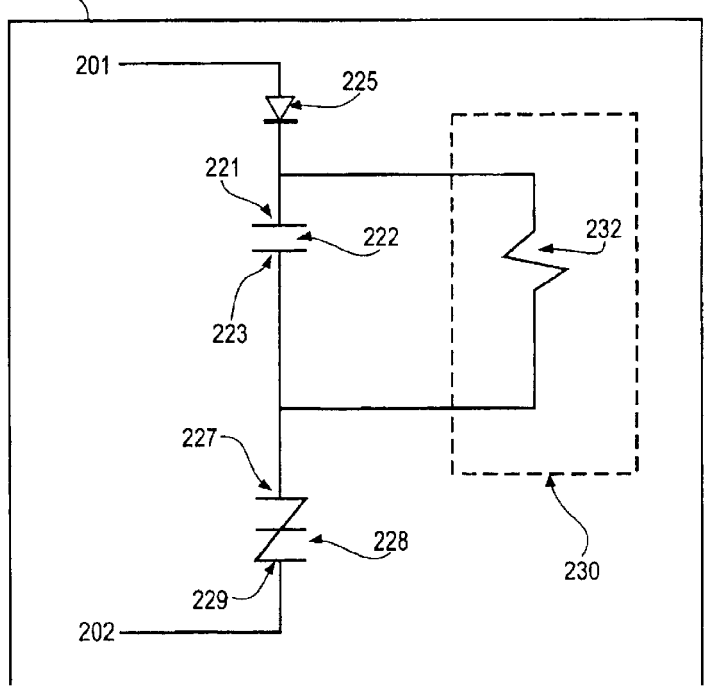
FIG. 4 is a schematic diagram illustrating the various components in a second potential embodiment of the passive transmitter of the present invention.

In another embodiment of the present invention shown in FIG. 4, passive transmitter 200 may further include a diode 225 in series with charge storage device 222 and voltage controlled switch 228. Diode 225 prevents current from being conducted in a predetermined direction through passive transmitter 200. As a result, the passive transmitter only generates a current spike during one half cycle of the AC wave. Whether the current spike is generated during the positive half cycle or during the negative half cycle of the AC wave is dependent upon the orientation of the diode as well as whether the hot lead from the branch circuit is connected to first lead 201 or second lead 202.

One approach to this embodiment utilizing a diode is shown in FIG. 4. The anode of the diode 225 is operably connected to the first lead and the cathode of the diode is connected to the first terminal 221 of the charge storage device. In this approach, when the first lead 201 is connected to the hot lead of the branch circuit, the passive transmitter will only generate a current spike during the positive half cycle of the AC wave. If the hot lead of the branch circuit is connected to the second lead 202, the passive transmitter will only generate a current spike during the negative half cycle of the AC wave.

Figure 5:
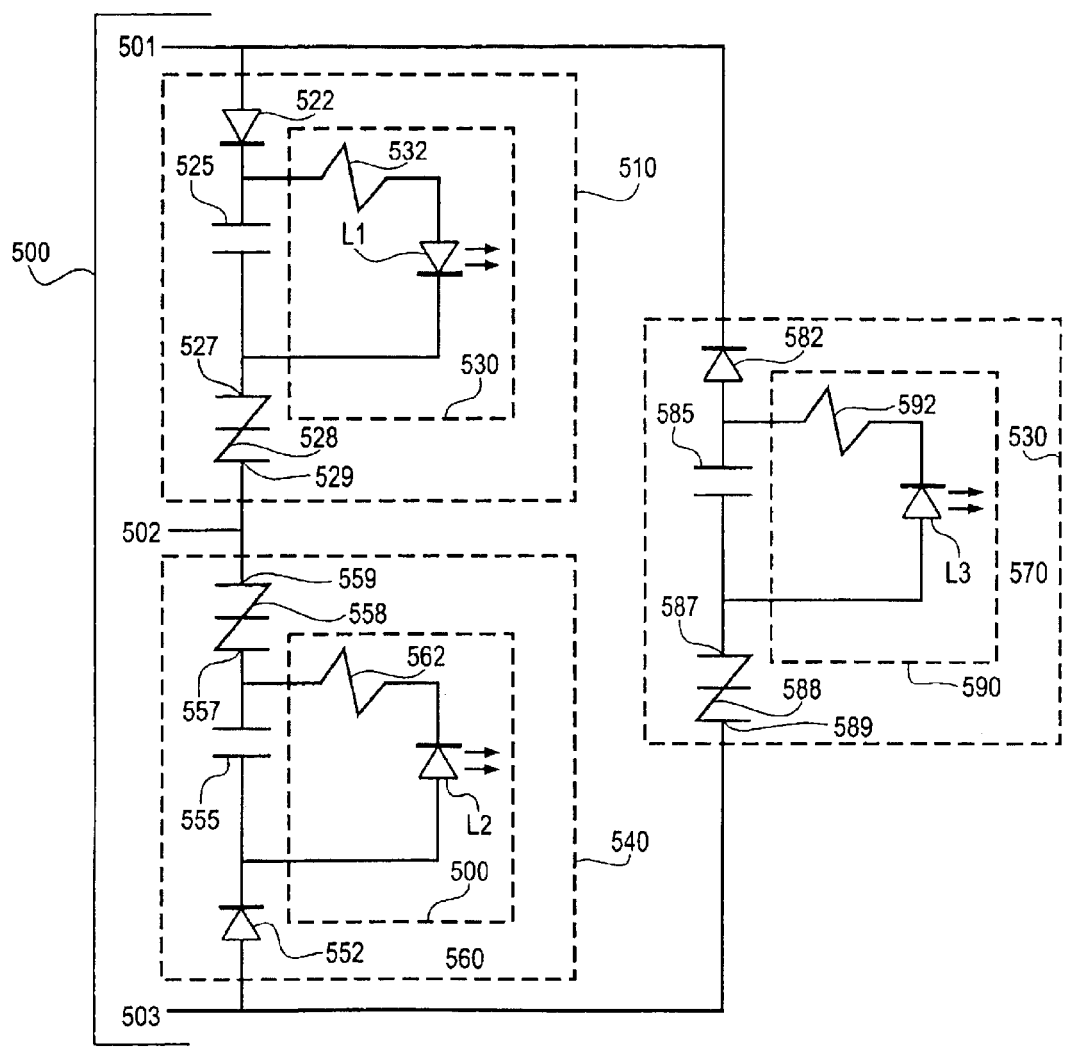
FIG. 5 is a schematic diagram illustrating the various components in a third potential embodiment of the passive transmitter of the present invention.
Figure 6A:
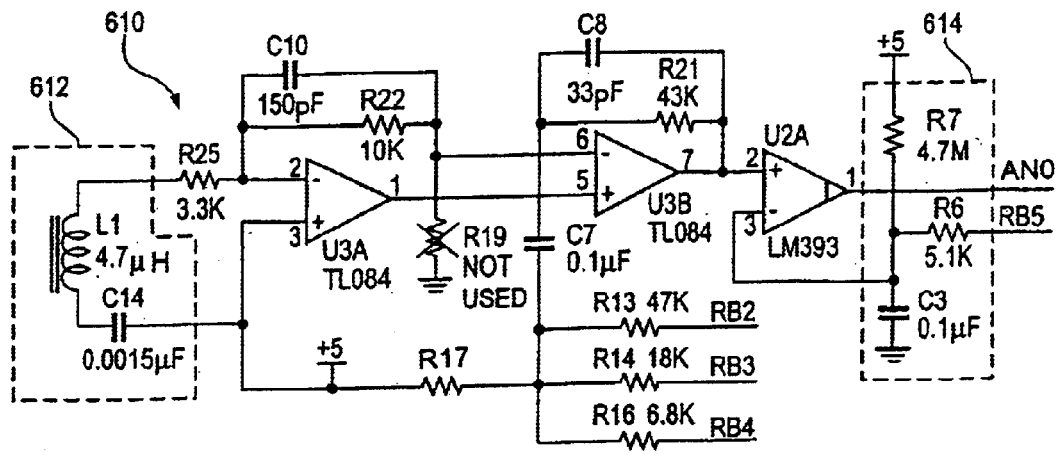
FIG. 6 is a schematic diagram illustrating the various components in a preferred embodiment of the receiver of the present invention.
Figure 6B:
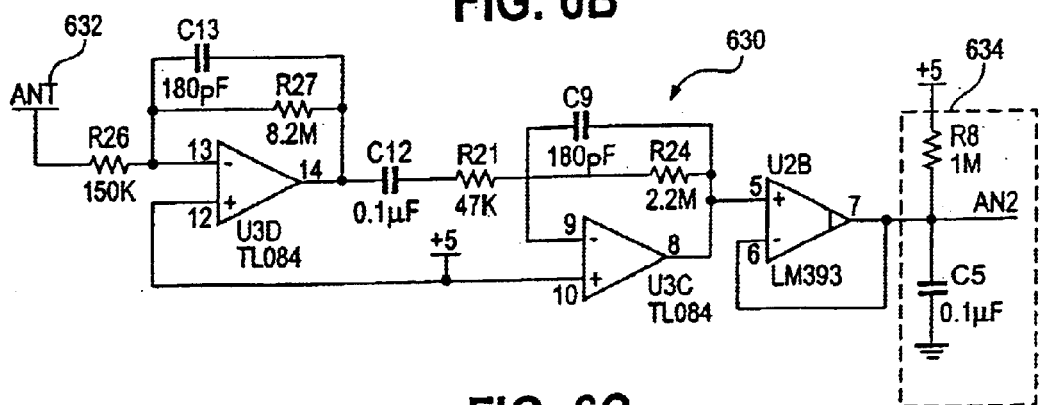
Figure 6C:
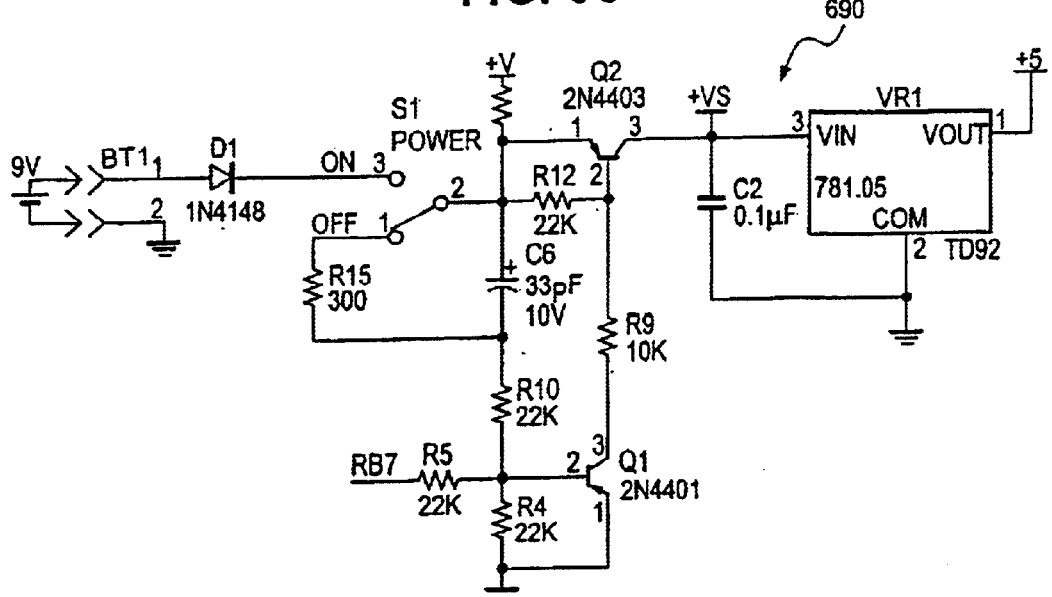
Figure 6D:
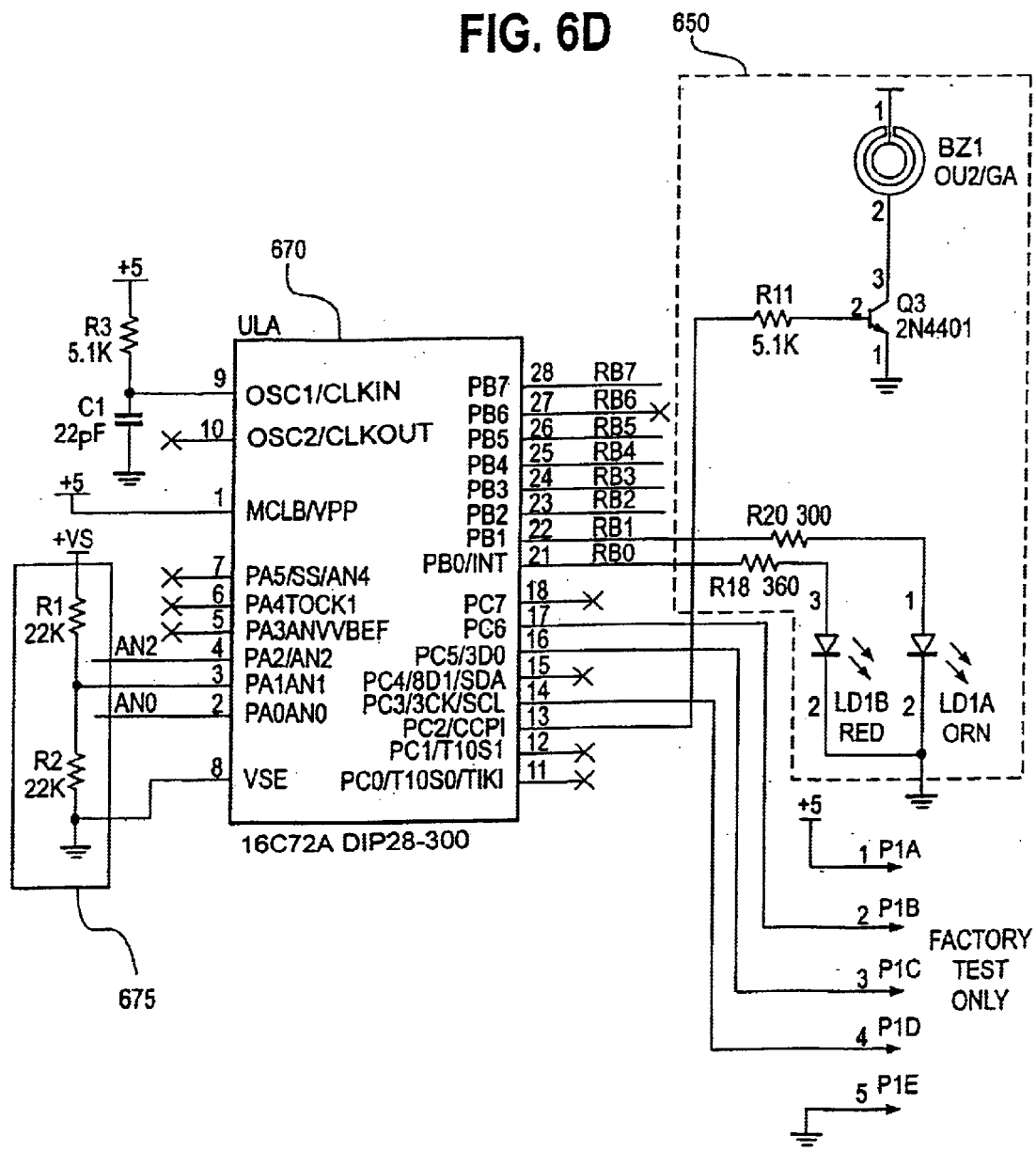

In another approach shown in FIG. 5, passive transmitter 500 has three subcircuits 510, 540, and 570. Each subcircuit 510, 540, and 570 includes a voltage controlled switch, a charge storage device, and a discharge circuit. Passive transmitter 500 further has a first lead 501, a second lead 502, and an optional third lead 503 for operably connecting to a particular branch circuit. Passive transmitter 500 will function regardless of which one of the leads 501, 502, or 503 are connected to the hot lead of a branch circuit and either neutral or ground is connected to at least one of the remaining leads. It is not necessary for all three leads to be connected to the branch circuit in order for the passive transmitter to function.

In this approach, first subcircuit 510 is connected between the first lead 501 and the second lead 502. First subcircuit 510 may include a diode 522, a charge storage device 525 and a voltage controlled switch 528 connected in series. Preferably, the anode of diode 522 is operably connected to first lead 501, and the cathode to charge storage device 525. The first terminal 527 of voltage controlled switch 528 is operably connected in series with charge storage device 525 and the second terminal 529 of voltage controlled switch 528 is connected to neutral lead 502. Discharge circuit 530 includes a resistor 532 that is in parallel with charge storage device 525.

The second subcircuit 540 is connected between third lead 503 and second lead 502. Like the first subcircuit, second subcircuit 540 may include a diode 552, a charge storage device 555, and a voltage controlled switch 558 in series. The anode of diode 552 is operably connected to third lead 503, and the cathode to charge storage device 555. A first terminal 557 of voltage controlled switch 558 is operably connected in series with charge storage device 555 and a second terminal 559 of voltage controlled switch 558 is connected to second lead 502. Discharge circuit 560 includes a resistor 562 that is in parallel to charge storage device 555.

In a similar fashion, the third subcircuit 570 is connected between first lead 501 and third lead 503. Third subcircuit 570 may also include a diode 582, a charge storage device 585, and a voltage controlled switch 583 in series. The anode of diode 582 is operably connected in series with charge storage device 585 and the cathode of diode 582 to first lead 501. The first terminal 589 of voltage controlled switch 588 is operably connected to third lead 503 and the second terminal 587 of voltage controlled switch 588 is connected in series with charge storage device 585. Discharge circuit 590 includes a resisor 592 that is in parallel to charge storage device 585.

Each subcircuit functions in the manner described above in order to generate a current spike. However, due to the orientation of the diodes 522, 552, and 582, the subcircuit(s) that actually generates the current spike is determined by the wiring scenario in a given situation. For example, in a properly wired circuit (meaning for purpose of this example the hot lead operably connected to first lead 501, neutral lead operably connected to second lead 502, and ground lead operably connected to third lead 503), the first sub circuit 510 will generate a current spike during the positive half cycle of the AC wave and the third subcircuit 590 will generate a current spike during the negative half wave cycle of the AC wave. As would be understood by those of skill in the art having the present application before them, other wiring scenarios will lead to other circuits being active.

Each discharge circuit may also include an optional light emitting diode ("LED") in series with the associated resistor. As shown in FIG. 5, LED L1 may be in series with resistor 532, LED L2 may be in series with resistor 562, and LED L3 may be in series with resistor 592. As the charge storage device discharges through its associated discharge circuit, the energy generated by this discharge circuit causes the associated LED to be illuminated. Thus, the LED will preferably be illuminated when the subcircuit associated with the LED generates a current spike. In this manner, the circuit will further function as a circuit fault indicator.

In a preferred design, LED L1 is a green light, LED L2 is a red light, and LED L3 is a yellow light to aid in user identification of wiring. The different illumination patterns of LED's L1, L2, and L3 created by various wiring scenarios are indicated in the following table:

|  | L1 | L2 | L3 |
| --- | --- | --- | --- |
| Properly Wired Circuit | ON | OFF | ON |
| Open ground | ON | OFF | OFF |
| Open neutral | OFF | OFF | ON |
| Reversed hot and neutral | ON | ON | OFF |
| Hot on neutral with open neutral | OFF | ON | OFF |
| Unenergized circuit | OFF | OFF | OFF |

Thus, the illumination pattern created by the light emitting diodes L1, L2, and L3 will serve to identify the wiring scenario in the current circuit.

It would be known to one of ordinary skill in art that the present system as disclosed herein would operate in the same manner with 60 Hz AC power as is common in the United States and with 50 Hz AC power line as is commonly found in countries foreign to the United States.

FIG. 6 of the drawings depicts an approach to the present system's receiver unit. Receiver 600 is broadly tuned about the predetermined frequency of the current spike signal that is created by the passive transmitter on a particular branch circuit 40. Receiver 600 drives a user-perceivable signaling device that is activated when receiver senses a signal with the predetermined frequency.

The receiver 600 is preferably a hand-held system. It may be designed to be used as a stand alone device (without using the transmitter) in voltage sensor mode, for the purpose of detecting a low frequency magnetic field as it is formed around energized power line conductors. When the receiver is utilized to scan the energized wiring system, the unit may be used as either a locator for the circuit interrupting device (circuit breaker or fuse) which protects the particular branch circuit where the transmitter is connected, or the receiver 600 can be used to trace energized power line wires which are hidden behind solid objects such as walls, conduits or other obstructions. Two further features may include an automatic power-off function and a low battery indicator.

Receiver 600 includes an HF pulse detector circuit 610, a field detector circuit 630, a user-perceivable signaling device 650, a microcontroller 670, and a power supply circuit 690.

In order to receive the current spike signals generated by the associated transmitter unit, inductor L1 is connected in series with capacitor C14, which make up a series-resonant tuned circuit 612 with a resonant frequency defined according to the following formula:

$$f=1/(2*PI*(LC)^{0.5})$$

Inductor L1 may be mounted towards the nose of receiver 600 such that the nose can be pointed by a user towards a circuit breaker panel to physically determine the branch to which circuit passive transmitter 200 is connected to. The nominal values of L1 and C14 lead to a resonant frequency of about 60 kHz.

Yet, because circuit 612 is broadly tuned it merely helps to reject other signals having frequencies far from the resonant frequency that may be present on the power lines being tested. Resistor R25 provides damping for the tuned circuit 612. Without damping resistor R25, the tuned circuit 612 might oscillate for a few cycles at its resonant frequency when exposed to a noise impulse on the power lines, possibly causing receiver 600 to detect a false transmitter signal when in fact no transmitter signal is present.

HF pulse detector circuit 610 includes an operational amplifier U3A. The positive terminal of the op amp connects to voltage reference VR (preferably 5 volts) that is generated by the power supply circuit 690. The AC gain of the amplifier U3A is generally determined by the ratio of resistor R22 to resistor R25. Using the nominal values shown in FIG. 6, the gain would be about 3.3 at 60 kHz with the gain rolling off at frequencies above 60 kHz to avoid interference by other noise sources. The DC gain of the op amp is approximately unity, since no DC current flows from the output of the op amp, past the inverting input of the op amp, to ground. DC current is substantially blocked by capacitor C14. Therefore, the output of the op amp is an AC signal centered at about 5 VDC. Preferably, op amp U3A is one section of a type TL084 quad op amp package as it is a higher speed device able to handle signals in the 60 kHz region.

The HF pulse detector circuit further includes a variable gain operational amplifier U3B. The output signal from op amp U3A is directly coupled to op amp U3B's non-inverting input. As with op amp U3A, the DC gain of op amp U3B is approximately unity, and the output of op amp U1B is centered at about 5VDC. The AC gain of op amp U3B is determined primarily by the ratio of feedback resistor R21 to the network of resistors R13, R14, R16, and R17. R13, R14 and R16 are switched in and out of the circuit by microcontroller 670 by software configurable input/output pins RB2, RB3 and RB4, respectively, on the microcontroller 670. When microcontroller 670 configures port pins RB2, RB3 or RB4 as inputs, they have very high effective impedance, effectively removing R13, R14 and R16, respectively, from the AC circuit gain of op amp U3B. When the microcontroller 670 configures port pins RB2, RB3 or RB4 as outputs, with a logic high output level, then R13, R14 or R16, respectively, are in parallel with R17.

When only R17 is in the circuit, the AG gain of op amp U3B is approximately 1.3. When R13, R14, R16, or any combination thereof are switched in parallel with R17, the gain increases. Thus, the software within the microcontroller 670 effectively controls the gain of op amp U3B by switching resistors R13, R14 and R16 in and out. This capability allows the microcontroller 670 to detect HF signals over a wide dynamic range, using only low cost components.

The non-inverting input of a comparator U2A connects to the output of U3B. The inverting input, as well as the output, of comparator U2A connects to an RC filter circuit 614 comprised of resistor R7 and capacitor C3. This RC circuit 614 has a time constant of about 0.5 seconds. In the absence of an HF signal, the non-inverting input of comparator U2A is at 5 volts. The open-collector output of comparator U2A will be turned "off" as long as its non-inverting input is more positive than the inverting input of U2A, allowing resistor R7 to charge capacitor C3 up to 5 volts. When an HF signal is present, HF pulses are amplified by op amps U3A and U3B, causing the output of op amp U3B to oscillate around the DC value of about 5 volts. During the negative portion of the pulses, whenever the instantaneous value of the voltage at the non-inverting input of comparator U2A dips below the voltage stored by capacitor C3 and sensed by the inverting input of comparator U2A, then the output stage of comparator U2A will turn on, tending to discharge capacitor C3. Once capacitor C3 has been sufficiently discharged that its voltage is no longer smaller than the voltage at the non-inverting input of comparator U2A, comparator U2A switches off its output stage. The capacitor C3 discharges quickly because the output of comparator U2A is a saturated transistor to ground, while resistor R7 can only slowly charge capacitor C3 back up to 5 volts. Comparator U2A acts as a negative peak detector and rectifier that can generate output voltage continuously from 5 volts down to 0 volts. (While a discrete signal diode could substitute, there may be a dead band due to the forward voltage drop of the diode (0.7V). Such a dead band will minimize efficacy of the diode).

Microcontroller port pin RB5 connects through resistor R6 to the peak detector output. When microcontroller 670 port pin RB5 is set by software as an input, its high impedance has no effect on the peak detector. When port pin RB5 is set to an active-high output, current through resistor R6 rapidly charges capacitor C3 to its maximum voltage of 5 volts. This arrangement allows microcontroller 670 to reset capacitor C3 to 5 volts, which is necessary when switching gain ranges using port pins RB2, RB3, and RB4 as described above. When the gain is increased, then the old peak value at the output of comparator U2A must be erased, so as to capture the new peak value in the new range of signal strengths. The output of comparator U2A is connected to analog input port AN0 of microcontroller 670. In the absence of an HF signal, the microcontroller 670 sees a signal of about 5 volts. The stronger the HF signal, the more that the voltage at AN0 decreases towards 0 volts. The microcontroller 670 measures the relative strength of the HF signal at analog input AN0.

60 Hz signals are detected by the field detector circuit 630. Field detector circuit 630 includes an antenna 632 located at the nose of the receiver. Antenna 632 is preferably a copper foil area on both sides of the receiver's printed circuit board.

The field detector circuit further includes an operational amplifier U3D. The inverting input circuit of op amp U3D is a high impedance circuit, toward facilitating detection of weak AC fields. The non-inverting input of op amp U3D connects to +5V and since the DC gain of U1 is about unity, the DC output level is approximately 5 volts. AC gain is based upon the nominal values shown is about 55, as determined by the ratio of resistor R27 to resistor R26. Capacitor C13 is intended to remove high frequency noise.

60 Hz signals are further amplified by operational amplifier U3C. Because of the high gain at op amp U3D, C12 is a DC blocking capacitor that prevents any input offset voltage at op amp U3D to be amplified by U3D's gain and resulting in a shift in the DC output at pin 14 away from the intended 5 volt level.

Negative peak detector comparator U2B connects to the output of U3C. Its output connects to an RC filter circuit 634 (consisting of R8 and C5). The output of comparator U2B is also connected to analog input channel AN2 of the microcontroller 670. In the absence of a 60 Hz input signal, the microcontroller 670 sees a signal of about 5 volts. When a 60 Hz signal is present, resulting signals are amplified by op amps U3D and U3C, causing the output of U3C to oscillate around the DC value of 5 volts. During the negative portions of the pulses, the output stage of comparator U2B conducts, momentarily discharging the RC circuit 634. The stronger the 60 Hz signal, the more that the voltage at AN2 decreases towards 0 volts. The microcontroller 670 measures the strength of the 60 Hz signal at analog input AN2. The field detector circuit may similarly be used to detect 50 Hz signals by altering the component values.

Microcontroller 670 in one embodiment of the invention is a Microchip PIC16C72A microcontroller. Microcontroller 670 preferably contains software.

User perceivable signaling device 650 may be a visual signal, an audible signal, or both. In the present implementation, the visual signal device is an LED L1. LED L1 is preferably a three lead, two color device. Microcontroller port pins RB1 and RB0 may control the green and red segments of L1. Resistors R20 and R18 establish appropriate LED currents when these segments are turned on. A yellow appearance may be generated when both the red and green segments are on simultaneously.

An audible signal device in the present invention is a buzzer BZ1. Buzzer BZ1 provides strong audible indication of the functions of the receiver. In the present implementation, the buzzer BZ1 is a piezoelectric beeper with built-in oscillator. The microcontroller 670 turns it on by asserting a logic high level at port pin PC2, which turns on transistor Q3 through resistor R11, which in turn switches on BZ1.

The power supply circuit in the present implementation of the invention is driven by a nine volt battery BT1. Diode D1 serves to protect the electronics against an unintentional reversal of the battery BT1. Though the construction of the battery terminals prevent continued operation with reversed polarity, it is possible for the user to momentarily misconnect the battery clip while trying to insert a new battery.

This invention will be further explained by way of example. The user turns on the receiver 600 by throwing the power switch S1 from the OFF to the ON position. The switch S1 connects the positive terminal of the battery BT1 to the circuit V+. Transistor Q2 also turns on, providing +VS to the op amp positive power rail and to the input terminal of voltage regulator VR1.

Transistor Q2 is preferably a PNP transistor whose base connects to resistor R12, tending to keep Q2 off. Q2 will turn on if transistor Q1 turns on, sinking current through resistor R9. Q1 has a pull-down resistor R4, which tends to keep it turned off. Q1 will turn on if either R5 or R10 is connected to a positive terminal.

When the power switch S1 is first turned on, capacitor C6 is initially discharged. The negative terminal of C6 is also at battery potential. This voltage level causes sufficient current to flow through resistor R10 to turn on Q1, which turns on Q2.

However, C6 gradually charges through R10, and the current through R10 into the base of Q1 diminishes, which causes Q1 to shut off after about one half second. However, shortly after start-up, the microcontroller 670 turns on port pin RB7 in order to lock the power supply on. As long as port pin RB7 is at a high level, current through resistor R5 keeps transistor Q1 on, which keeps transistor Q2 on.

When the receiver 600 has been inactive for a predetermined period of time (no HF or AC signals have been detected), microcontroller 670 may turn off port pin RB7 in order to go to sleep and avoid unnecessary battery drain. Q2 then shuts off, and only a very small leakage current is drained from the battery BT1. To start up again, the user must first shut off S1. This switches resistor R15 across C6, making sure that it is quickly discharged. The user then turns S1 back on and the cycle repeats.

Furthermore, a resistor divider 675 (see FIG. 6) made up of R1 and R2 measures the battery voltage. The microcontroller software adjusts the input voltage at AN1 for the voltage drop across D1 and Q2. When the potential falls below a preset limit, the microcontroller signals a low-battery condition and shuts the receiver off.

Figure 7:
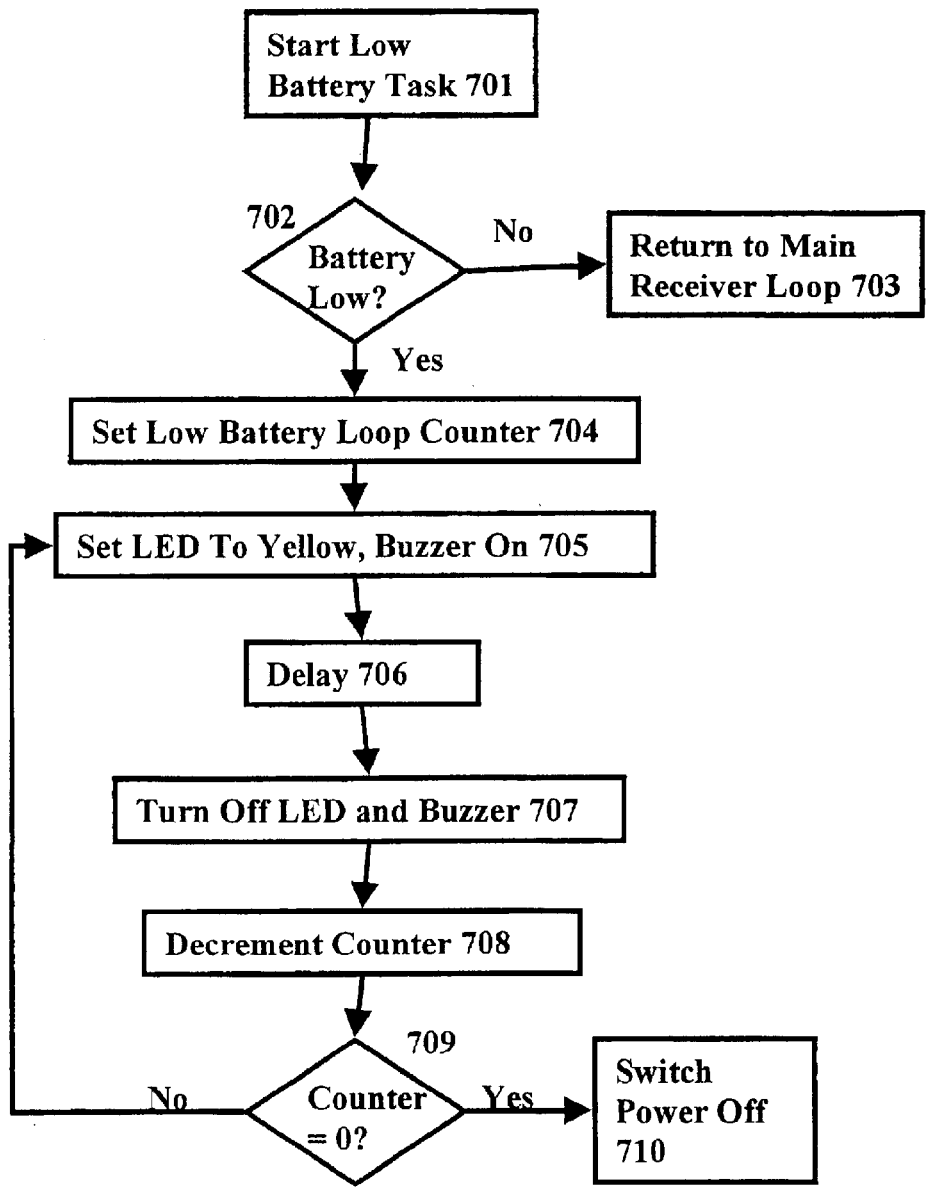
FIG. 7 is a flow chart depicting a low battery task performed by the receiver of FIG. 6.

FIG. 7 is a flow chart of the low battery task program 700 operating. After a start state 701, the battery level is checked in step 702. If it is normal, step 703 returns control of the main receiver loop. If the battery is low, control passes to step 704 that sets a low battery loop counter. In the preferred embodiment, the loop counter is set to 3. In step 705, the LED is switched to a yellow color and the preselected sound pattern that indicates low battery is selected. After a predetermined delay in step 706, the LED and the sound pattern are turned off in step 707. The loop counter is then decremented by 1 in step 708. If the counter is 0, the power is shut off (step 710). If the counter is not 0, the LED is once again switched on and the preselected sound patterns is selected. In the preferred embodiment, steps 705–708 flash the LED and beep the buzzer three times time before shutting off the power.

Figure 8:
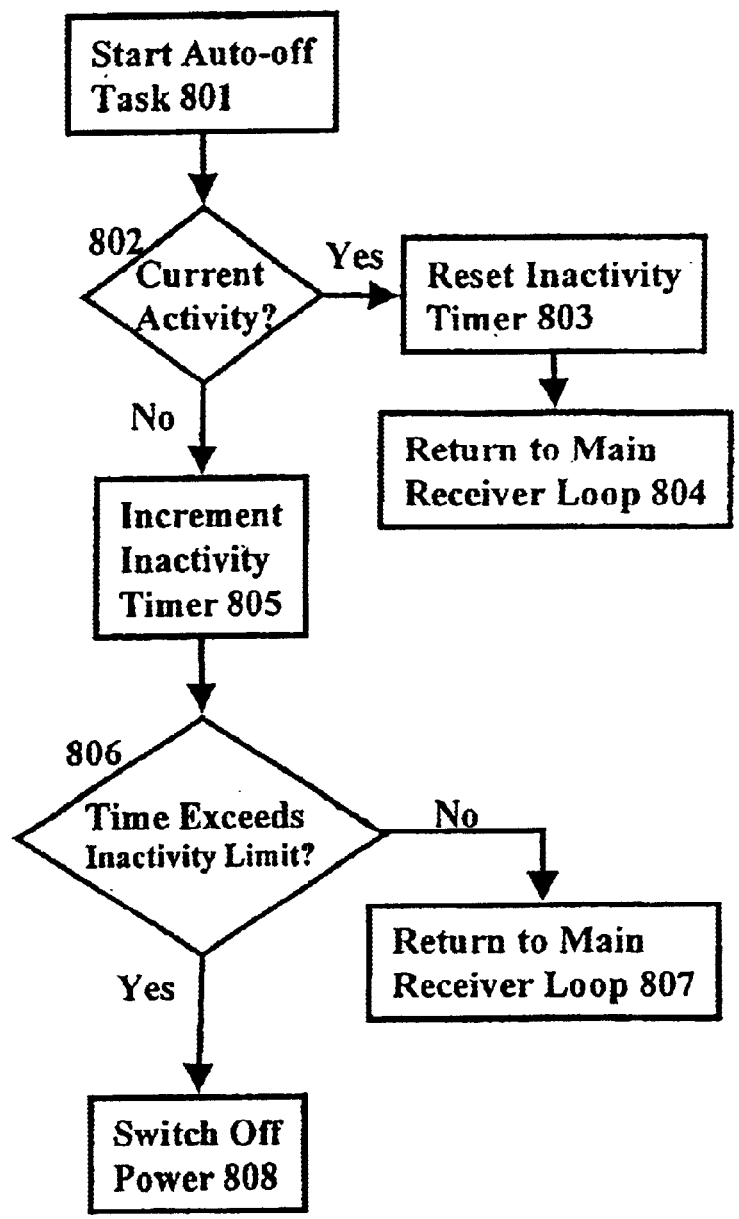
FIG. 8 is a flow chart depicting an AutoOff operation performed by the receiver of FIG. 6.

FIG. 8 is a flow chart of the AutoOff operation, generally depicted as numeral 800. The main receiver software loop periodically invokes the auto-off task 801. In step 802, the software checks whether there is any HF detector or AC detector activity. If there is activity, flow passes to step 803 in which an inactivity timer is reset to 0 and control returns to the main receiver loop (step 804).

If there is no current receiver activity, the inactivity timer is incremented (step 805). Step 806 checks whether the receiver has been inactive for greater than a preset amount of time. In the preferred embodiment, the preset amount of time is 10 seconds. If the receiver has not been inactive for 10 seconds, control is returned to the main receiver loop (step 807). If the inactivity has reached 10 seconds, the power is switched off in step 808.

Figure 9:
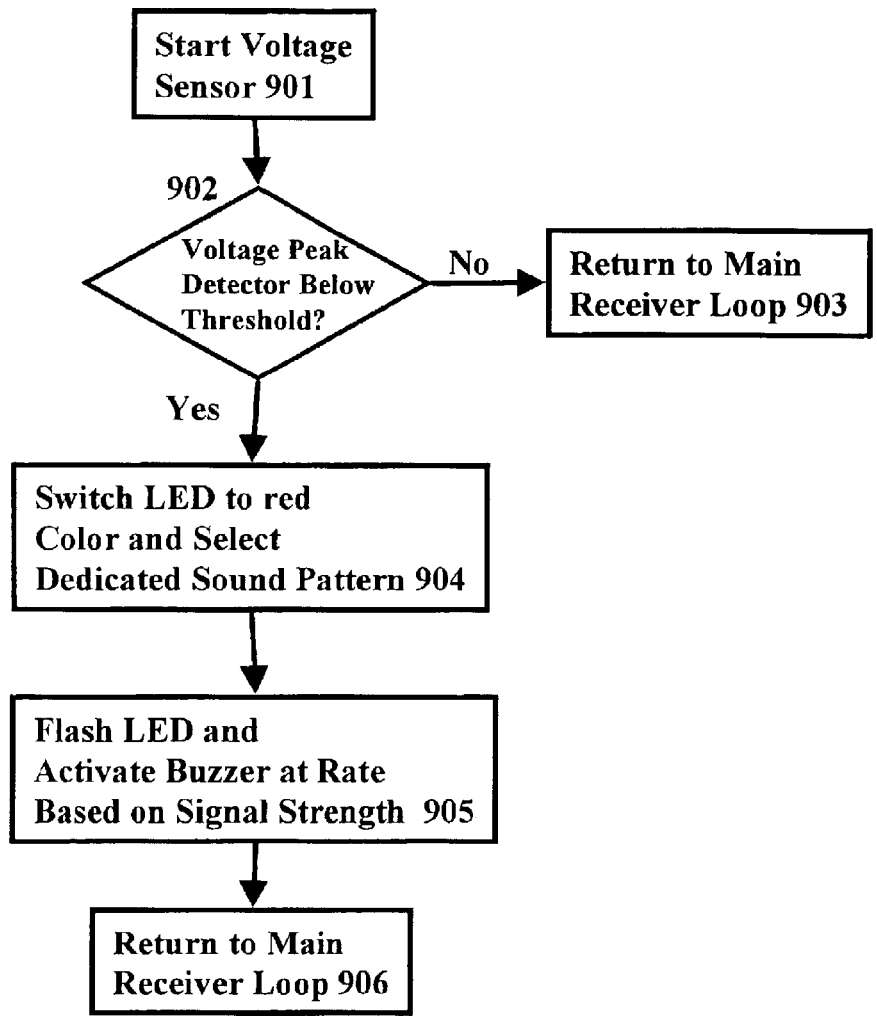
FIG. 9 is a flow chart depicting a voltage sensor operation performed by the receiver of FIG. 6.

The flow chart of FIG. 9 depicts the voltage sensor operation (900). After a start state 901, the software checks the analog input voltage from the AC detector stage 630 (FIG. 6). As previously described with respect to the operation of field detector 630, the voltage at microcontroller 670 analog input AN2 decreases as the 60 Hz field increases. In step 902, this input is compared against a preset threshold, and if the voltage has not fallen below the threshold, control is returned to the main receiver loop in step 903. If, however, a signal is detected, the LED is switched to a red color and the buzzer is turned on (step 904). The LED and buzzer are then flashed and beeped at a speed proportionate to the detected signal strength (step 905).

It should be noted that any receiver capable of picking up a predetermined signal can be used in association with the passive transmitters disclosed herein.

The foregoing description and drawings merely explain and illustrate the invention and the invention is not limited thereto. Those of the skill in the art who have the disclosure before them will be able to make modifications and variations therein without departing from the scope of the present invention.

We claim:

1. A system for locating a circuit interrupter associated with a selected branch circuit from amongst a plurality of circuit interrupting devices, each circuit interrupter within said plurality of circuit interrupting devices being operably connected in series between a power line and a respective branch circuit, each branch circuit having a hot lead and a neutral lead, said system comprising:

a receiver broadly tuned about a predetermined frequency of a current spike signal created on said selected branch circuit by a transmitter, said receiver driving a user-perceivable signaling device upon sensing said current spike signal; and said transmitter creating said current spike signal on said selected branch circuit at said predetermined frequency upon operable connection to said selected branch circuit, said current spike signal having a sufficiently short spike duration and a sufficient amplitude so as to substantially minimize development of a sympathetic signal on other branch circuits adjacent to said selected branch circuit, said transmitter including a plurality of subcircuits, each of the plurality of subcircuits having a voltage controlled switch in series with a charge storage device;

whereby upon operable connection to said selected branch circuit, in at least one of the plurality of subcircuits, said voltage controlled switch is triggered into conductance by application of a voltage in excess of a breakover voltage across said voltage controlled switch, allowing current to flow through said charge storage device; causing said charge storage device to charge and instantaneously developing a current spike signal for transmission on said selected branch circuit; and whereby said receiver detects said current spike signal solely when in proximity to said circuit interrupter associated with said selected branch circuit as said current spike signal on said selected branch circuit is easily distinguished from said sympathetic signal developed on any of said other branch circuits.

2. The system of claim 1, wherein the voltage controlled switch is constructed to conduct upon application of a voltage in excess of a breakover voltage across said voltage controlled switch; whereby upon said voltage controlled switch conducting, current flows through said charge storage device, causing said charge storage device to charge and instantaneously developing a current spike signal.

3. The system of claim 1, wherein the voltage controlled switch is a SIDAC.

4. The system of claim 1, wherein the charge storage device is a capacitor.

5. The system of claim 1, wherein the transmitter further includes a diode in series with said charge storage device in at least one of said subcircuits; whereby said transmitter creates a current spike during only one half cycle of an alternating current flowing through said hot lead of said selected branch circuit.

6. The system of claim 1, wherein the transmitter further includes means for creating a current spike during only one half cycle of an alternating current flowing through said hot lead of said selected branch circuit.

7. The system of claim 1, wherein the transmitter further includes a discharge circuit in parallel with said charge storage device, in at least one of said subcircuits, whereby said voltage controlled switch blocks current flow once a voltage across said voltage controlled switch falls below a minimum holding voltage, causing said charge storage device to discharge an energy stored in said charge storage device through said discharge circuit.

8. The system of claim 7, wherein said discharge circuit includes a resistor.

9. The system of claim 7, wherein the discharge circuit has an impedance such that the discharge circuit and the charge storage device form an RC circuit having a time constant, said time constant determined in relation to a desired number of said current spikes created in relation to cycles of an alternating current flowing through said hot lead of said selected branch circuit.

10. The system of claim 7, wherein said discharge circuit includes a signal device whereby said signal device produces a cue in response to an energy discharge from said charge storage device.

11. The system of claim 10, wherein said signal device is a light emitting diode.

12. The system of claim 1, wherein the transmitter further includes means for producing a user-perceivable signal in response to a current spike being created by an associated charge storage device.

13. The system of claim 1, wherein a firing subcircuit from the plurality of subcircuits is determined by a wiring scenario of an electrical receptacle to which said transmitter is connected; wherein said firing subcircuit creates said current spike on said selected branch circuit.

14. The system of claim 1, wherein said transmitter further includes a plurality of indicator means for providing an indication that an electrical receptacle to which the transmitter is connected is wired in accordance with a predetermined arrangement.

15. The system of claim 14, wherein the plurality of indicator means comprises a plurality of light emitting diodes.

16. The system of claim 15, wherein the plurality of light emitting diodes is illuminated in combination to indicate a wiring condition selected from the set of wiring conditions consisting of:

correct wiring;

open ground;

open neutral;

reversed polarity;

hot on neutral with open neutral; and unenergized circuit.

17. The system according to claim 1, wherein said receiver includes:

a microcontroller;

a high frequency pulse detector circuit broadly tuned about said predetermined frequency of said current spike signal generated by said transmitter on said selected branch circuit; said high frequency pulse detector circuit operably connected to said microcontroller;

a user perceivable signaling device operably connected to said microcontroller; and a power supply operably connected to said microcontroller;

whereby said user perceivable signaling device is driven in response to said high frequency pulse detector circuit sensing said current spike signal.

18. The system according to claim 17, further including a field detector circuit for detecting a predetermined alternating current signal, said field detector circuit operably connected to said microcontroller.

19. The system of claim 18, wherein said field detector circuit detects a 60 Hz signal.

20. The system of claim 18, wherein said field detector circuit detects a 50 Hz signal.

21. The system according to claim 17, wherein said signaling device includes a visual signaling device and an audible signaling device, each of said visual signaling device and audible signaling device being operably connected to said microcontroller.

22. The system according to claim 1, wherein said current spike signal has a spike duration no longer than about 10 microseconds.

23. The system of claim 1, wherein the transmitter comprises a first lead and at least one of a second lead and a third lead; and wherein the transmitter creates said current spike when one of the first, second and third leads is connected to the hot lead of the branch circuit and another of the first, second and third leads is connected to one of the neutral lead and a safety ground lead of the branch circuit.

24. A transmitter for use in a system for locating a circuit interrupter associated with a selected branch circuit from amongst a plurality of circuit interrupting devices, each circuit interrupter within said plurality of circuit interrupting devices being operably connected in series with a power line and a respective branch circuit, each branch circuit having a hot lead and a neutral lead, said transmitter creating a current spike on said selected branch circuit, said transmitter including a plurality of subcircuits, each of the plurality of subcircuits comprising:

a voltage controlled switch constructed to conduct upon application of a voltage in excess of a breakover voltage across said voltage controlled switch; and a charge storage device in series with said voltage controlled switch;

whereby upon operable connection to said selected branch circuit, in at least one of the plurality of subcircuits, said voltage controlled switch is triggered into conductance by application of a voltage in excess of a breakover voltage across said voltage controlled switch, allowing current to flow through said charge storage device; causing said charge storage device to charge and instantaneously developing a current spike signal for transmission on the selected branch circuit, said current spike having a predetermined frequency and a sufficiently short spike duration so as to substantially minimize development of a sympathetic signal on other branch circuits adjacent to said selected branch circuit.

25. The transmitter of claim 24, wherein the voltage controlled switch is a SIDAC.

26. The transmitter of claim 24, wherein the charge storage device is a capacitor.

27. The transmitter of claim 24, further including a discharge circuit in parallel with said charge storage device, in at least one of said subcircuits, whereby said voltage controlled switch blocks current flow once a voltage across said voltage controlled switch falls below a minimum holding voltage, causing said charge storage device to discharge an energy stored in said charge storage device through said discharge circuit.

28. The transmitter of claim 27, wherein the discharge circuit includes a resistor.

29. The transmitter of claim 27, wherein the discharge circuit has an impedance such that the discharge circuit and the charge storage device form an RC circuit having a time constant, said time constant determined in relation to a desired number of said current spikes created in relation to cycles of an alternating current flowing through said hot lead of said selected branch circuit.

30. The transmitter of claim 27, wherein the discharge circuit includes a signal device in parallel with said charge storage device whereby said signal device produces a cue in response to an energy discharge from said charge storage device.

31. The transmitter of claim 30, wherein said signal device is a light emitting diode.

32. The transmitter of claim 24, further including a diode in series with said charge storage device; whereby said transmitter creates a current spike during only one half cycle of an alternating current flowing through said hot lead of said selected branch circuit.

33. The transmitter of claim 24, further including means for creating a current spike during only one half cycle of an alternating current flowing through said hot lead of said selected branch circuit.

34. The transmitter of claim 24, further including means for producing a user-perceivable signal in response to a current spike being created by an associated charge storage device.

35. The system of claim 24, wherein a firing subcircuit from the plurality of subcircuits is determined by a wiring scenario of an electrical receptacle to which said transmitter is connected; wherein said firing subcircuit creates said current spike on said selected branch circuit.

36. The transmitter of claim 24, further including a plurality of indicator means for providing an indication that an electrical receptacle to which the transmitter is connected is wired in accordance with a predetermined arrangement.

37. The transmitter of claim 36, wherein the plurality of indicator means comprises a plurality of light emitting diodes.

38. The transmitter of claim 37, wherein the plurality of light emitting diodes is illuminated in combination to indicate a wiring condition selected from the set of wiring conditions consisting of:

correct wiring;

open ground;

open neutral;

reversed polarity;

hot on neutral with open neutral; and unenergized circuit.

39. The transmitter of claim 24, wherein the transmitter comprises a first lead and at least one of a second lead and a third lead; and wherein the transmitter creates said current spike when one of the first, second and third leads is connected to the hot lead of the branch circuit and another of the first, second and third leads is connected to one of the neutral lead and a safety ground lead of the branch circuit.

40. A method for locating a circuit interrupter associated with a selected branch circuit from amongst a plurality of circuit interrupting devices, each circuit interrupter within said plurality of circuit interrupting devices being operably connected in series between a power line and a respective branch circuit, each branch circuit having a hot lead and a neutral lead, said method comprising:

(a) operably connecting a transmitter to a selected branch circuit, said transmitter having a plurality of subcircuits, each of the plurality of subcircuits comprising a voltage controlled switch in series with a charge storage device;

(b) creating a current spike on the selected branch circuit at a predetermined frequency, whereby upon operable connection of the transmitter to the selected branch circuit, in at least one of the plurality of subcircuits, the voltage controlled switch is triggered into conductance by application of a voltage in excess of a breakover voltage across said voltage controlled switch, allowing current to flow through said charge storage device, causing said charge storage device to charge and instantaneously developing a current spike signal for transmission on said selected branch circuit;

(c) inducing only a substantially weak electromagnetic field about the selected branch circuit by limiting the current spike signal to a sufficiently short duration;

(d) placing a receiver broadly tuned about the predetermined frequency of the current spike signal in physical proximity to each of the plurality of circuit interrupting devices individually; and (e) driving a user-perceivable signaling device when the receiver is coupled to the weak electromagnetic field generated at the predetermined frequency of the current spike signal.

41. The method of claim 40, further including indicating that an electrical receptacle to which the transmitter is connected is wired in accordance with a predetermined arrangement.

42. The method of claim 40, wherein the transmitter comprises a first lead and at least one of a second lead and a third lead; and wherein the transmitter creates said current spike when one of the first, second and third leads is connected to the hot lead of the branch circuit and another of the first, second and third leads is connected to one of the neutral lead and a safety ground lead of the branch circuit.

43. A system for locating a circuit interrupter associated with a selected branch circuit from amongst a plurality of circuit interrupting devices, each circuit interrupter within said plurality of circuit interrupting devices being operably connected in series between a power line and a respective branch circuit, each branch circuit having a hot lead and a neutral lead, said system comprising:

a receiver broadly tuned about a predetermined frequency of a current spike signal created on said selected branch circuit by a transmitter, said receiver driving a user-perceivable signaling device upon sensing said current spike signal; and said transmitter creating said current spike signal on said selected branch circuit at said predetermined frequency upon operable connection to said selected branch circuit, said current spike signal having a sufficiently short spike duration and a sufficient amplitude so as to substantially minimize development of a sympathetic signal on other branch circuits adjacent to said selected branch circuit, said transmitter including a voltage controlled switch in series with a charge storage device;

whereby upon operable connection to said selected branch circuit, said voltage controlled switch is triggered into conductance by application of a voltage in excess of a breakover voltage across said voltage controlled switch, allowing current to flow through said charge storage device; causing said charge storage device to charge and instantaneously developing a current spike signal on said selected branch circuit;

whereby said receiver detects said current spike signal solely when in proximity to said circuit interrupter associated with said selected branch circuit as said current spike signal on said selected branch circuit is easily distinguished from said sympathetic signal developed on any of said other branch circuits; and wherein said transmitter further includes a plurality of indicator means for providing an indication that an electrical receptacle to which the transmitter is connected is wired in accordance with a predetermined arrangement.

44. The system of claim 43, wherein the transmitter comprises a first lead and at least one of a second lead and a third lead; and wherein the transmitter creates said current spike when one of the first, second and third leads is connected to the hot lead of the branch circuit and another of the first, second and third leads is connected to one of the neutral lead and a safety ground lead of the branch circuit.

45. A system for locating a circuit interrupter associated with a selected branch circuit from amongst a plurality of circuit interrupting devices, each circuit interrupter within said plurality of circuit interrupting devices being operably connected in series between a power line and a respective branch circuit, each branch circuit having a hot lead and a neutral lead, said system comprising:

a receiver broadly tuned about a predetermined frequency of a current spike signal created on said selected branch circuit by a transmitter, said receiver driving a user-perceivable signaling device upon sensing said current spike signal; and said transmitter creating said current spike signal on said selected branch circuit at said predetermined frequency upon operable connection to said selected branch circuit, said current spike signal having a sufficiently short spike duration and a sufficient amplitude so as to substantially minimize development of a sympathetic signal on other branch circuits adjacent to said selected branch circuit, said transmitter including a voltage controlled switch in series with a charge storage device;

whereby upon operable connection to said selected branch circuit, said voltage controlled switch is triggered into conductance by application of a voltage in excess of a breakover voltage across said voltage controlled switch, allowing current to flow through said charge storage device; causing said charge storage device to charge and instantaneously developing a current spike signal on said selected branch circuit;

whereby said receiver detects said current spike signal solely when in proximity to said circuit interrupter associated with said selected branch circuit as said current spike signal on said selected branch circuit is easily distinguished from said sympathetic signal developed on any of said other branch circuits; and wherein said receiver includes:
- a microcontroller;
- a high frequency pulse detector circuit broadly tuned about said predetermined frequency of said current spike signal generated by said transmitter on said selected branch circuit; said high frequency pulse detector circuit operably connected to said microcontroller;
- a user perceivable signaling device operably connected to said microcontroller; and
- a power supply operably connected to said microcontroller;
- whereby said user perceivable signaling device is driven in response to said high frequency pulse detector circuit sensing said current spike signal.

46. The system of claim 45, wherein the transmitter comprises a first lead and at least one of a second lead and a third lead; and wherein the transmitter creates said current spike when one of the first, second and third leads is connected to the hot lead of the branch circuit and another of the first, second and third leads is connected to one of the neutral lead and a safety ground lead of the branch circuit.

47. A transmitter for use in a system for locating a circuit interrupter associated with a selected branch circuit from amongst a plurality of circuit interrupting devices, each circuit interrupter within said plurality of circuit interrupting devices being operably connected in series with a power line and a respective branch circuit, each branch circuit having a hot lead and a neutral lead, said transmitter creating a current spike on said selected branch circuit, said transmitter comprising:
- a voltage controlled switch constructed to conduct upon application of a voltage in excess of a breakover voltage across said voltage controlled switch;
- a charge storage device in series with said voltage controlled switch;
- whereby upon operable connection to said selected branch circuit, said voltage controlled switch is triggered into conductance by application of a voltage in excess of a breakover voltage across said voltage controlled switch, allowing current to flow through said charge storage device; causing said charge storage device to charge and instantaneously developing a current spike signal on selected branch circuit, said current spike having a predetermined frequency and a sufficiently short spike duration so as to substantially minimize development of a sympathetic signal on other branch circuits adjacent to said selected branch circuit; and
- a plurality of indicator means for providing an indication that an electrical receptacle to which the transmitter is connected is wired in accordance with a predetermined arrangement.

48. The transmitter of claim 47, wherein the transmitter comprises a first lead and at least one of a second lead and a third lead; and wherein the transmitter creates said current spike when one of the first, second and third leads is connected to the hot lead of the branch circuit and another of the first, second and third leads is connected to one of the neutral lead and a safety ground lead of the branch circuit.

49. A system for locating a circuit interrupter associated with a selected branch circuit from amongst a plurality of circuit interrupting devices, each circuit interrupter within said plurality of circuit interrupting devices being operably connected in series between a power line and a respective branch circuit, each branch circuit having a hot lead and a neutral lead, said system comprising:
- a receiver broadly tuned about a predetermined high frequency of a current spike signal created on said selected branch circuit by a transmitter, said receiver driving a user-perceivable signaling device upon sensing said current spike signal, the receiving including:
  - a high frequency pulse detector circuit broadly tuned about said predetermined frequency of said current spike signal generated by said transmitter on said selected branch circuit,
  - a user perceivable signaling device operably connected to said high frequency pulse detector, and
  - a power supply operably connected to said high frequency pulse detector,
  - whereby said user perceivable signaling device is driven in response to said high frequency pulse detector circuit sensing said current spike signal; and
- said transmitter creating said current spike signal on said selected branch circuit at said predetermined high frequency upon operable connection to said selected branch circuit;
- whereby upon operable connection to said selected branch circuit, said voltage controlled switch is triggered into conductance by application of a voltage in excess of a breakover voltage across said voltage controlled switch, allowing current to flow through said charge storage device; causing said charge storage device to charge and instantaneously developing a current spike signal for transmission on said selected branch circuit; and
- whereby said receiver detects said current spike signal solely when in proximity to said circuit interrupter associated with said selected branch circuit as said current spike signal on said selected branch circuit is easily distinguished from said sympathetic signal developed on any of said other branch circuits.

50. The system of claim 49, wherein the transmitter comprises a first lead and at least one of a second lead and a third lead; and wherein the transmitter creates said current spike when one of the first, second and third leads is connected to the hot lead of the branch circuit and another of the first, second and third leads is connected to one of the neutral lead and a safety ground lead of the branch circuit.

51. The system of claim 49, wherein the receiver includes a variable gain input stage.

52. The system of claim 51, wherein a gain of the variable gain input stage is automatically adjusted to distinguish the current spike signal from said sympathetic signal developed on any of the other branch circuits.

53. The system of claim 52, wherein the gain of the variable gain input stage is initially set to a maximum gain value and then automatically adjusted to lower gain values until the current spike signal is identified.

54. A receiver for use in a system for locating a circuit interrupter associated with a selected branch circuit from amongst a plurality of circuit interrupting devices, each circuit interrupter within said plurality of circuit interrupting devices being operably connected in series with a power line and a respective branch circuit, each branch circuit having a hot lead and a neutral lead, said transmitter creating a current spike on said selected branch circuit, said receiver comprising:
- a high frequency pulse detector circuit broadly tuned about said predetermined frequency of said current spike signal generated by said transmitter on said selected branch circuit;

a user perceivable signaling device operably connected to said high frequency pulse detector; and a power supply operably connected to said high frequency pulse detector, wherein said receiver is broadly tuned about a predetermined high frequency of the current spike signal created on said selected branch circuit by the transmitter, wherein said user perceivable signaling device is driven in response to said high frequency pulse detector circuit sensing said current spike signal, and wherein said receiver detects said current spike signal solely when in proximity to said circuit interrupter associated with said selected branch circuit as said current spike signal on said selected branch circuit is easily distinguished from said sympathetic signal developed on any of said other branch circuits.

55. The system of claim 54, wherein the receiver includes a variable gain input stage.

56. The system of claim 55, wherein a gain of the variable gain input stage is automatically adjusted to distinguish the current spike signal from said sympathetic signal developed on any of the other branch circuits.

57. The system of claim 56, wherein the gain of the variable gain input stage is initially set to a maximum gain value and then automatically adjusted to lower gain values until the current spike signal is identified.

* * * * *